United States Patent
Gilman

(10) Patent No.: US 8,105,869 B1
(45) Date of Patent: Jan. 31, 2012

(54) METHOD OF MANUFACTURING A SILICON-BASED SEMICONDUCTOR DEVICE BY ESSENTIALLY ELECTRICAL MEANS

(75) Inventor: Boris Gilman, Mountain View, CA (US)

(73) Assignee: Gilman, Boris, Mountain View, CA (US)

( * ) Notice: Subject to any disclaimer, the term of this patent is extended or adjusted under 35 U.S.C. 154(b) by 78 days.

(21) Appl. No.: 12/804,655

(22) Filed: Jul. 28, 2010

(51) Int. Cl.
*H01L 21/00* (2006.01)

(52) U.S. Cl. .......................................... 438/98; 438/469

(58) Field of Classification Search .................... 438/57, 438/69, 93–98, 469
See application file for complete search history.

(56) References Cited

U.S. PATENT DOCUMENTS

| | | | |
|---|---|---|---|
| 4,589,191 A * | 5/1986 | Green et al. ..................... | 438/72 |
| 6,262,359 B1 | 7/2001 | Meir et al. | |
| 6,429,037 B1 | 8/2002 | Wenham et al. | |
| 6,695,903 B1 | 2/2004 | Kubelbeck et al. | |
| 6,825,104 B2 | 11/2004 | Horzel et al. | |
| 7,358,169 B2 | 4/2008 | Zhu et al. | |
| 7,615,393 B1 | 11/2009 | Shah et al. | |
| 2005/0227446 A1 | 10/2005 | Kao et al. | |
| 2007/0064066 A1* | 3/2007 | Piatt et al. ...................... | 347/74 |
| 2009/0025786 A1 | 1/2009 | Rohathi et al. | |
| 2009/0044858 A1 | 2/2009 | Wang et al. | |
| 2010/0012185 A1 | 1/2010 | Schmid et al. | |
| 2010/0098840 A1 | 4/2010 | Du et al. | |
| 2010/0321478 A1* | 12/2010 | Sliwa et al. ..................... | 348/51 |

FOREIGN PATENT DOCUMENTS

BG  109881  12/2008

OTHER PUBLICATIONS

"Crystalline and thin-film silicon solar cells: state of the art and future potential" by Dr. Martin A. Green, Solar Energy, V. 74, 181-192 (2003).

* cited by examiner

*Primary Examiner* — Richard A. Booth

(57) ABSTRACT

Proposed is the method for forming selective emitters, field-induced emitters, back-surface field regions, and contacts to the functional regions of a solar cell by essentially electrical means and without conventional thermal diffusion and masking processes. The process includes forming conductive layers on both sides of an intermediate solar-cell structure, performing electrical and thermal treatment by passing electrical current independently through the front-side conductive layer and the back-side conductive layer, thus forming the selective emitters, the selective BSF regions, selective emitter contact regions, and contacts to the selective BSF regions. The obtained structure is then subjected to pulse electrical treatment by applying a voltage pulse or pulses between the front and back conductive layers to form the field-induced emitter and the field-induced BSF region. After the conductive layers are removed, a final solar cell is obtained. The proposed method can significantly simplify manufacturing, reduce cost, and increase throughput in the field of semiconductor fabrication.

22 Claims, 7 Drawing Sheets

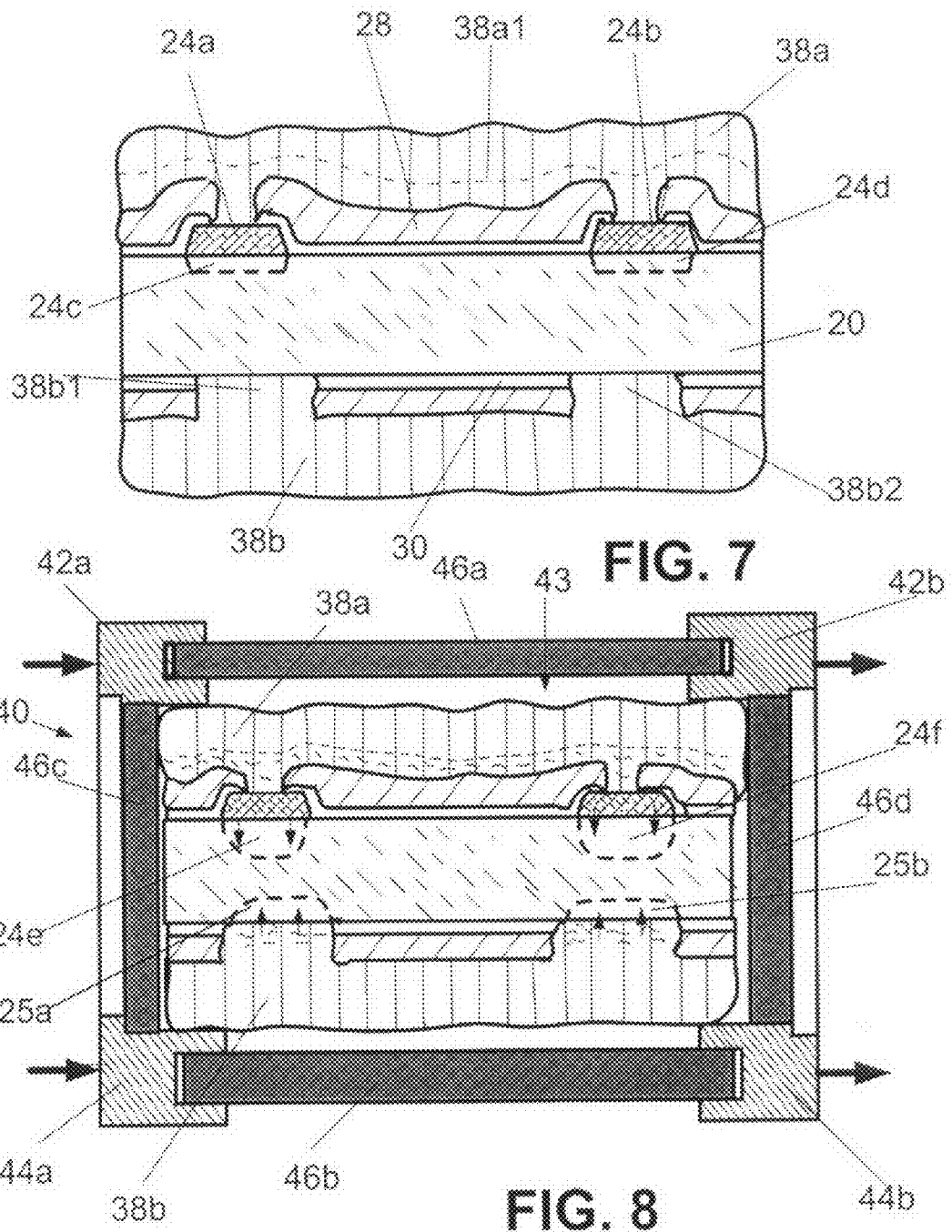

METHOD OF MANUFACTURING A SILICON-BASED SEMICONDUCTOR DEVICE BY ESSENTIALLY ELECTRICAL MEANS

FIELD OF THE INVENTION

The invention relates to the manufacture of monocrystalline, polycrystalline, or microcrystalline silicon-based semiconductor devices, particularly photovoltaic devices such as solar cells. More specifically, the invention relates to the method of forming selective emitters, field-induced emitters, back-surface field regions, and contacts to functional regions by essentially electrical means and without conventional thermal diffusion and masking processes. The proposed method can significantly simplify manufacturing, reduce cost, and increase throughput in the field of semiconductor fabrication.

BACKGROUND

At the present time solar cells are classified into three generations, which are described below.

First-generation solar cells are silicon-based solar cells that dominate the solar market (80 to 90%). Solar cells of this type are manufactured of monocrystalline or polycrystalline silicon, and, in spite of high manufacturing cost (typically ranging from $3/W to $5/W which is much higher than is required for wide implementation), popularity of these solar cells results from their high efficiency, well developed processing, and practically unlimited availability of silicon.

Solar cells of the second generation are also known as thin-film solar cells. The cells of this type are less expensive, lighter in weight, and more attractive in appearance than solar cells of the first generation. However, they are less efficient than first-generation cells.

Third-generation solar cells do not need the p-n junction necessary in traditional silicon-based and thin film cells. Third-generation cells contain a wide range of potential solar innovations, including polymer solar cells, nanocrystalline, nanomaterial-based cells, and dye-sensitized solar cells.

Irrespective of a provision of later generations, interest in solar cells of the first generation remains very keen, and research in this direction continues. The high fabrication cost of the first-generation solar cells results mainly from several high-temperature processes required to form functional p-n junctions, barrier layers, passivation and contact regions, emitters and selective emitters, back-surface field (BSF) regions, which are required on front-surface modifications, and front-surface field (FSF) regions, which are required on back-surface modifications, etc.

The aforementioned processes are typically performed in high-temperature thermal diffusion furnaces, belt furnaces, and rapid thermal annealing (RTA) chambers. Diffusion and annealing processes are generally power-consuming and time-consuming, and equipment with which these processes are carried out generally requires periodic calibration, testing, and maintenance. Another source of complexity and cost increase in the manufacture of first-generation solar cells is patterning, a process that typically involves the use of photolithography for forming selective emitters, contact regions, electrodes, and other cell elements.

Attempts have been made to simplify fabrication of silicon-based solar cells, e.g., by reducing the number of masking, diffusion, and passivation steps, which are used in screen printing or jet printing with consecutive annealing of screen-printed layers. For example, conductive electrodes can be formed by the screen-printing technique on both sides of a solar cell (for front-side screen-printing and annealing, refer to "Crystalline and thin-film silicon solar cells: state of the art and future potential" by Dr. Martin A. Green, *Solar Energy*, Vol. 74, pp. 181 to 192 (2003) and for back-side screen-printing and annealing, refer to U.S. Patent Application Publication No. 20090025786, published on Jan. 29, 2009, inventors: Ajeet Rohatgi, et al).

U.S. Patent Application Publication No. 20100012185 (published on Jan. 21, 2010; inventors: Christian Schmid, et al) and U.S. Pat. No. 6,262,359 issued on Jul. 17, 2001 to Daniel Meier, et al, describe a process wherein aluminum or aluminum-containing paste is deposited on the back side of a solar cell and is annealed to create a back-surface field (BSF) region without performing a thermal diffusion step.

Some known methods offer formation of conductive electrodes by applying aluminum- or silver-containing paste by means of a screen-printing process and then melting the paste for penetration thereof through dielectric passivation layers for forming contacts directly on the front-side N-type emitters of the cell (see e.g., U.S. Patent Application Publication No. 20090044858 published on Feb. 19, 2009, inventors: Yueli Y. Wang, et al) or by forming a BSF region and a back side contact of the solar cell (see U.S. Patent Application Publication No. 20100098840 published on Apr. 22, 2010; inventor Chen-Hsun Du, et al, and U.S. Pat. No. 6,695,903 issued on Feb. 24, 2004 to Armin Kubelbeck, et al).

It is known in the art to apply a dopant paste onto a substrate, e.g., by screen printing, and then to use the dopant paste to form selectively doped regions in the Si substrate. For example, U.S. Pat. No. 6,825,104 issued on Nov. 30, 2004 to J. Horzel, et al, describes a method of manufacturing a semiconductor device wherein a pattern of solid dopant is selectively applied to the surface of a semiconductor substrate after which the dopant atoms are diffused from the solid dopant source into said substrate to form a first diffused region by controlled heat treatment in a gaseous environment surrounding the semiconducting substrate. At the same time, the dopant source is diffused into the substrate indirectly by means of said gaseous environment, whereby a second diffusion region is formed at least in some areas of the substrate not covered by the pattern. In the final stage a metal contact pattern is formed substantially in alignment with the first diffusion region without substantial etching of the second diffusion region.

U.S. Pat. No. 6,429,037 issued on Aug. 6, 2002 to Stuart R. Wenham, et al, discloses a method for forming selective emitters without recourse to a conventional diffusion step generally required for the formation of heavily doped regions of selective emitters. This is achieved by means of laser-assisted local heating of a dopant source that also serves as a passivation layer and mask for consequent metallization. The method also allows formation of self-aligned contacts on selective emitter regions. This method has some advantages; however, it requires at least one thermal diffusion operation, complex optimization of the laser operation, and, potentially, additional deposition and annealing steps.

Another efficient attempt to minimize the number of diffusion, passivation, and masking operations in solar cell fabrication is disclosed in U.S. Pat. No. 7,615,393 issued on Nov. 10, 2009 to Sunil Shah, et al. The method described in this patent provides a substrate that is doped with boron and includes a first substrate surface with a first surface region and a second surface region. A first set of nanoparticles, which includes a first dopant, is deposited on the first surface region. The substrate is heated in an inert ambient to a first temperature, whereby a first densified film is created, and then a first diffused region is formed with the first diffusion depth in the substrate beneath the first surface region. The method also includes exposing the substrate to a diffusion gas that includes phosphorous at a second temperature for forming a phosphosilicate glass (PSG) layer on the first substrate surface, and then a second diffused region with a second diffusion depth is formed in the substrate beneath the second surface region wherein the first diffused region is proximate to the second diffused region. The method further includes exposing the substrate to an oxidizing gas at a third temperature, wherein an $SiO_2$ layer is formed between the PSG layer and the substrate surface, wherein the first diffusion depth is substantially greater than the second diffusion depth. Thus, multidoped junctions are formed on a substrate essentially without photolithography.

While this method represents an interesting advance toward simplification of solar cell manufacturing, it still requires at least one complex thermal diffusion process (step that includes using a dopant gas). Also, diffusion of phosphorus onto the front surface is conducted simultaneously with diffusion of aluminum onto the back side, which may cause uncontrolled doping on the back-side doped regions. Furthermore, this method requires alignment of the metal electrodes to the doped selective emitter (front side) and BSF regions (back side), which is not done automatically and which may involve additional steps.

Bulgarian Patent No. BG109881 issued on Dec. 30, 2008 to Petko Vitanov, et al, describes a solar cell with a field-induced emitter in the form of an inversion layer wherein the front-side emitter is formed by an electric field generated by an electric charge developed in a dielectric antireflective coating on the front surface of the solar cell. However, this type of cell requires formation of selective N+ doped emitters and BSF regions (needed to provide contact regions for photocurrent) by means of conventional high-temperature diffusion.

Analysis of prior art shows that although a significant reduction in number of masking, diffusion, and passivation operations has been achieved in the manufacture of solar cells, none of the existing methods eliminate the thermal diffusion and masking steps required to form emitters, selective emitters, BSF, FSF, self-aligned electrodes, and other solar cell elements. Therefore, the cost of manufacturing silicon-based solar cells remains relatively high.

SUMMARY

The present method provides formation of a solar cell structure that includes selective emitters, field-induced emitters, back-surface field (BSF) regions, self-aligned contacts, and other elements of a solar cell by means of electrical and thermal treatment without furnace-based thermal diffusion and/or photolithography. Once an initial device structure is formed, an entire functional solar cell structure is essentially formed by well-defined electrical and thermal treatment and by applying a consecutive well-defined series of electrical pulses.

More specifically, the method comprises the following consecutive steps.

In Step 1 a silicon substrate is provided, and a dopant substance is applied onto the front side of the substrate to form local dot-like or stripe-like dopant-containing regions. The dopant substance may comprise, e.g., phosphorus-doped nanoparticles or a phosphorus-containing paste applied, e.g., by screen printing or jet printing. The local dots or stripes are applied onto areas where selective emitters of the solar cell are to be formed in subsequent steps.

Step 2 is an initial sintering of the dopant substance. As a result, sintered dopant-containing regions are formed on the front side of the substrate, and shallow low-doped regions can be formed underneath the sintered dopant-containing regions. In other words, low-doped selective-emitter regions are formed. This step can be carried out in a simple Rapid Thermal Anneal (RTA) or similar nonvacuum chamber, e.g., in the atmosphere of nitrogen.

Step 3 comprises growing thin silicon oxide ($SiO_2$) layers on the front side and on the back side of the substrate, respectively. In the structure of the solar cell, the front side $SiO_2$ layer also functions as part of an antireflective coating, which, as shown later, includes silicon nitride. Oxidation causes further diffusion of the dopant from the dopant-containing regions into the silicon substrate, thus continuing the process of selective emitter formation.

In Step 4, a silicon nitride ($Si_3N_4$) film is deposited onto the entire front $SiO_2$ layer, and a $Si_3N_4$ film is deposited onto the entire back $SiO_2$ layer. The film may be deposited, e.g., by chemical vapor deposition. In combination with the $SiO_2$ layer on the front side of the substrate, the nitride film forms a front-side insulating film that functions as an antireflective coating. In combination with the $SiO_2$ layer on the back of the substrate, the nitride film forms a back-side insulating film that functions as back-side passivation.

Step 5 is aimed at forming windows on the front-side insulating film on the front side of the cell. The windows can be cut, e.g., by means of a laser or, alternatively, a single photolithography step may be required.

Step 6 comprises forming windows on the back side of the structure. The back windows are cut through the back-side insulating film to the back surface of the substrate. The back windows can be cut by means of a laser or chemically etched with the use, e.g., of a fixed shadow mask. No photolithography is needed in that case.

Step 7 comprises deposition of a front-side conductive layer and a back-side conductive layer of stacked metal layers or a metal-containing conductive paste onto the front and back surfaces of the structure. In other words, the conductive metal or metal-containing paste layers are deposited onto the surface of the front-side nitride film ($Si_3N_4$ film) and onto the surface of the front dopant-containing regions exposed through the front windows. Similarly, the conductive metal or metal-containing paste layers that form the back-side conductive layer are deposited onto the surface of the back-side nitride film ($Si_3N_4$ film) and onto the back-side surface of the substrate exposed through the back windows. The conductive metal layers used for the front surface can be silver, aluminum, titanium, palladium, nickel, or their combinations. Compositions of the conductive layers on the front and back can be different, and these layers can be deposited simultaneously or in sequence. The back-side conductive layer contains elements, which during electrical and thermal treatments function as a back-side dopant to form selective BSF regions.

Note that steps 1 through 7 were used to form an initial device structure as a basis for subsequent completion of the most critical elements of the solar cell by electrical and thermal means.

Step 8 comprises unique electrical and thermal processing of the initial device structure. In this step, electrical currents pass through the front-side conductive layer and the back-side conductive layer for the ohmic heating of layers. As a result of the elevated temperature, the dopants diffuse into the silicon substrate from the dopant-containing regions, thus forming selective emitters on the front and selective BSF regions on the back. During electrical and thermal treatments, the lower portion of the front conductive layer interacts with the underlying dopant-containing regions and with the selective emitters regions, whereby a metal-silicon alloy is formed in the zone of contact between the interacting materials. On the other hand, the interaction of the material of the front-side conductive layer with $Si_3N_4$ film will be different than that in the areas of the selective emitters. The front-side conductive layer and the backside conductive layer can be subjected to the above-described electrical and thermal treatments simultaneously or separately.

Step 9 is the pulse electrical treatment of the structure obtained after Step 8. In this step, a voltage pulse or sequence of voltage pulses V is applied between the conductive layer on the front and the conductive layer on the back. As a result, fixed charges of opposite signs form on the front-side insulating film and on the back-side insulating film in order to form the field-induced emitter and the field-induced BSF region.

Pulse V causes holes to drift toward one side of the substrate and to enter the front-side insulating film and the electrons to drift toward the opposite side of the substrate and to enter the back-side insulating film, wherein fixed charges are formed in the respective insulating films.

In the last Step 10a, the front-side conductive layer is removed, whereby a front-side solar cell is formed. In this cell, the remaining back-side conductive layer functions as a back reflector.

Alternatively, in Step 10b, the back-side conductive layer is also removed, whereby the front-side solar cell is formed without a back reflector.

If necessary, the outer surfaces of the solar cell obtained after Steps 10a and 10b may require some minor finishing operations such as chemical or mechanical polishing, chemical cleaning, or electroplating of the electrode surfaces.

BRIEF DESCRIPTION OF THE DRAWINGS

FIG. 7 illustrates Step 7, in which stacked conductive metal layers or metal-containing conductive paste layers are applied onto the front and back surfaces of the initial device structure.

FIG. 8 illustrates Step 8, which is a unique electrical and thermal treatment of the initial device structure in which electrical currents independently pass through the front-side conductive layer and the back-side conductive layer.

DETAILED DESCRIPTION OF THE INVENTION

The method of the invention for manufacturing a silicon-based semiconductor device by essentially electrical means will now be described in more detail by way of a specific example relating to manufacture of a solar cell. However, this example should not be construed as limiting the scope of the invention application to solar cells only. The method will be described in the form of sequential manufacturing steps with reference to the attached drawings. In these drawings, the substrate and other elements of the solar cell will be shown in a cross section.

Figure 1:
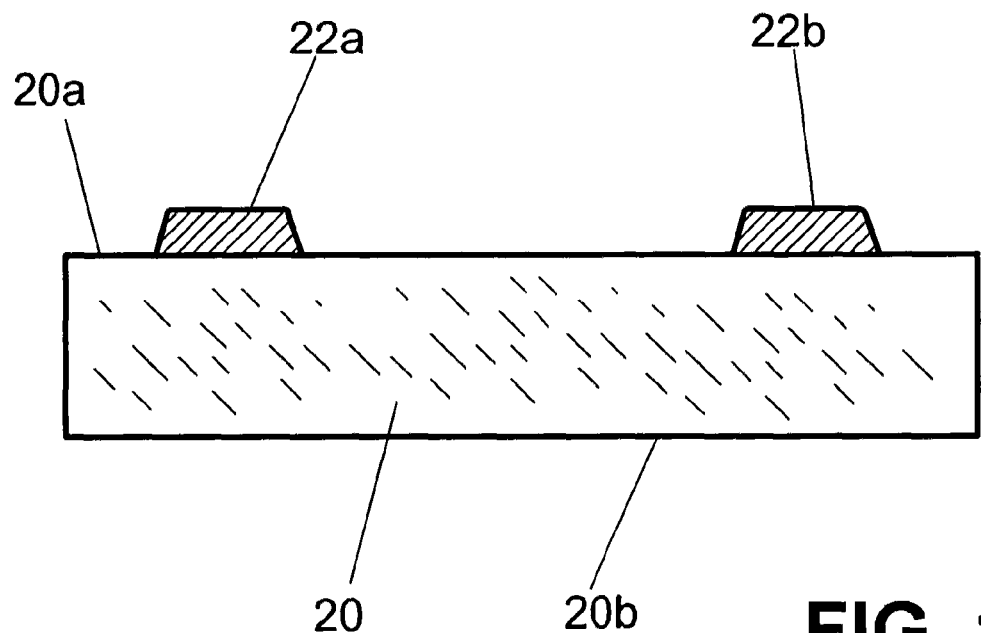
FIG. 1 illustrates Step 1 in which a silicon substrate is provided, and a dopant substance is applied in the form of dots or stripes. Hereinafter the structures are shown in cross sections.

Step 1 of the method is shown in FIG. 1. In this step a substrate 20 made of a monocrystalline silicon is provided, and a dopant substance is applied. The substrate 20 can be a P-type substrate, can have a thickness in the range of 200 to 300 μm, and can have a resistivity ranging from 1 to 10 Ohm·cm. The front side 20a of the substrate 20 can be textured (not shown). Reference numeral 20b designates the back side of the substrate 20. A dopant substance is applied onto the front side 20a of the substrate 20 to form local dot-like or stripe-like dopant-containing regions 22a and 22b. The dopant substance may comprise, e.g., phosphorus-doped nanoparticles (as described in aforementioned U.S. Pat. No. 7,615,393) or a phosphorus-containing paste applied by screen printing or jet printing. The dopant-containing stripes may have a thickness in the range of 400 to 800 nm and a width of 100 to 200 μm. The local dots or stripes 22a and 22b are applied onto areas where selective emitters of the solar cell are to be formed in subsequent steps.

Figure 2:
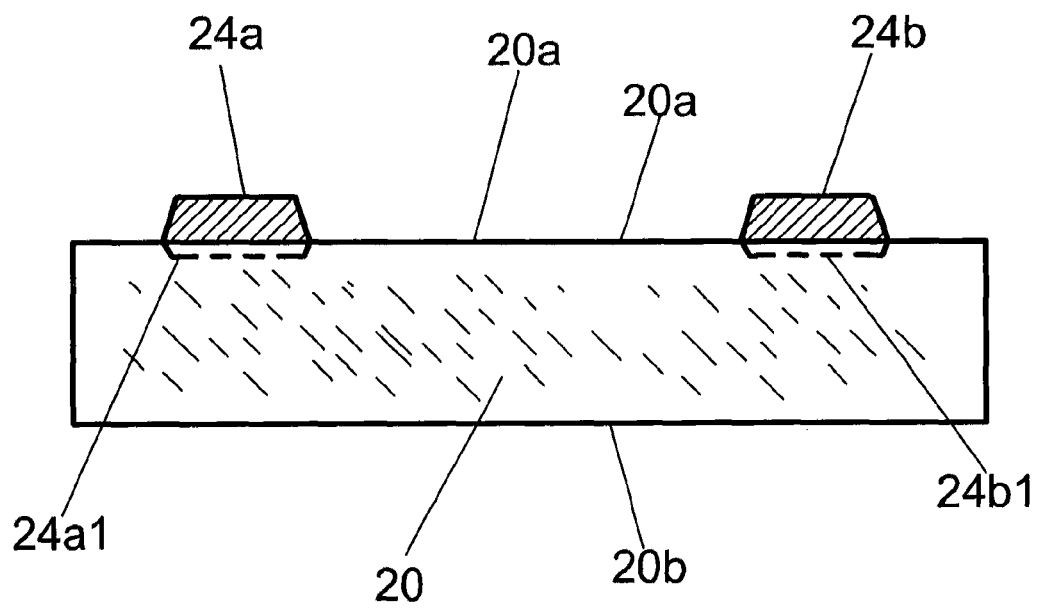
FIG. 2 illustrates Step 2, in which initial sintering of the dopant substance is carried out.

Step 2, which is shown in FIG. 2, is an initial sintering of the dopant substance shown in FIG. 1 in the form of dots or stripes 22a and 22b. Sintering, which is used for solidifying dopant-containing regions, can be carried out in an ambient atmosphere at a temperature in the range of 700° C. to 900° C. for a short time, e.g., between 5 and 20 sec. It is understood that the specific parameters for initial sintering need to be optimized for each particular dopant substance. As a result, sintered dopant-containing regions 24a and 24b are formed on the front side 20a of the substrate, and very shallow low-doped N-regions 24a1 and 24b1 can be formed underneath the sintered dopant-containing regions 24a and 24b, respectively. In other words, low-doped selective-emitter regions are formed. This step can be carried out in a simple Rapid Thermal Anneal (RTA) or similar nonvacuum chamber, e.g., in the atmosphere of nitrogen.

Figure 3:
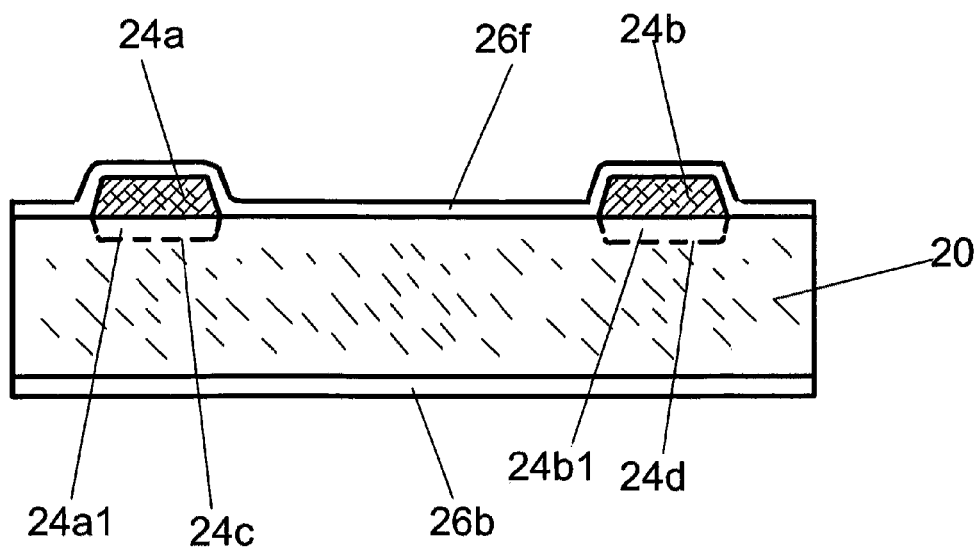
FIG. 3 illustrates Step 3, in which thin silicon oxide ($SiO_2$) layers are grown on the front side and on the back side of the substrate, respectively.

Step 3, which is shown in FIG. 3, comprises growing thin silicon oxide ($SiO_2$) layers 26f and 26b on the front side 20a and on the back side 20b of the substrate 20, respectively. The purpose of the $SiO_2$ layers is to reliably passivate the front-side and back-side surfaces, to create controlled hole injection (for the front-side 20a) and electron injection (for the back-side 20b), and to generate a charged retention barrier which may be required for dielectric charging in subsequent pulse electrical treatment (Step 9 which will be described later). In the structure of the solar cell, the front-side $SiO_2$ layer 26f also functions as part of an antireflective coating, which, as shown later, includes silicon nitride. Oxidation causes further diffusion of phosphorus from the dopant-containing regions 24a and 24b into the silicon substrate. The zones of deeper penetration of the phosphorus into the silicon, which are shown in FIG. 3 by broken lines 24c and 24d, designate starting areas for the formation of selective emitters.

Figure 4:
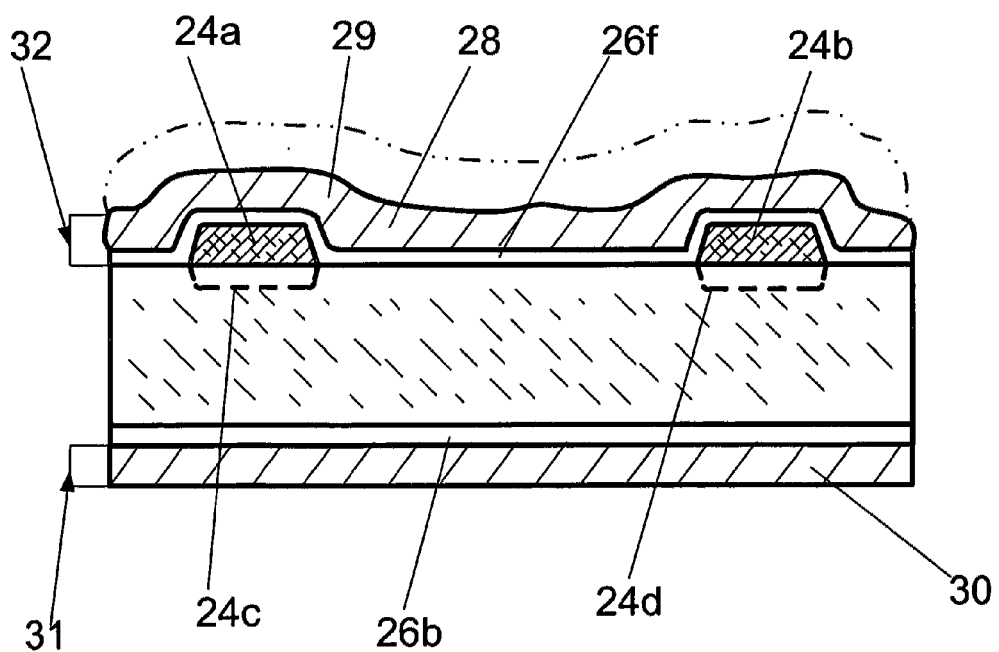
FIG. 4 shows Step 4, in which silicon nitride ($Si_3N_4$) film is deposited onto the entire front $SiO_2$ layer and the entire back $SiO_2$ layer. The front thin silicon oxide ($SiO_2$) layers and the front silicon nitride film form a front-side insulating film that functions in the final device as an antireflective coating.
Figure 12:
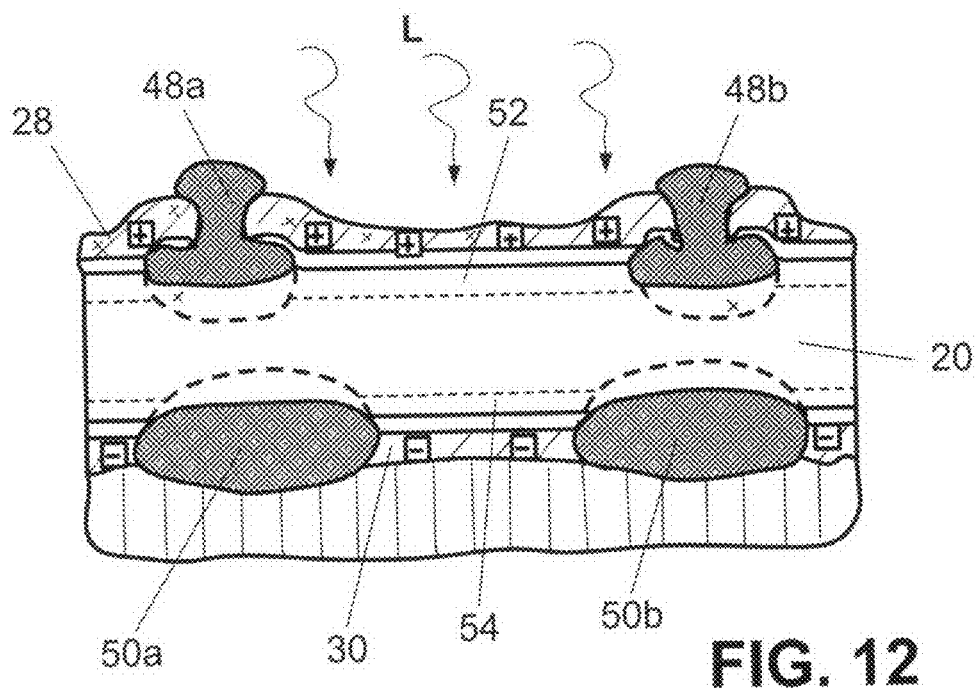
FIG. 12 shows the modification of a final solar cell obtained after Step 10a, in which only the front-side conductive layer of the structure in FIG. 11 is removed (e.g., by a lift-off process).

In Step 4, shown in FIG. 4, a silicon nitride ($Si_3N_4$) film 28 is deposited onto the entire front $SiO_2$ layer 26f, and a $Si_3N_4$ film 30 is deposited onto the entire back $SiO_2$ layer 26b. The film can be deposited, e.g., by means of chemical vapor deposition. In combination with the $SiO_2$ layer on the front side of the substrate 20, the nitride film 28 forms a front-side insulating film 32 that functions as an antireflective coating. In combination with the $SiO_2$ layer 26b on the back side of the substrate 20, the nitride film 30 forms a backside insulating film 31 that functions as back-side passivation (and back-reflection support for modifications to the solar cell with a back-side reflector, which is shown in FIG. 12 and is described below). The nitride film can have a thickness in the range of 65 to 75 nm.

Alternatively, the thickness may be in the range of 210 to 230 nm. The deposition temperature may be, e.g., in the range of 350 to 450° C. Alternatively, the nitride film can be deposited only onto the front $SiO_2$ layer 26f. To protect the front and back surfaces from potential penetration of metal atoms during subsequent steps in forming selective emitters, the initial thickness of the $Si_3N_4$ film may be greater than the upper limit of the above range. Therefore, an additional step of thinning the film to the range, e.g., of 65 to 75 nm, may be required at the end of the process. Alternatively, at this step an additional insulating film 29, e.g., of $SiO_2$, can be deposited on the top of the $Si_3N_4$ film 28. At the end of the process this additional film is removed.

Figure 5:
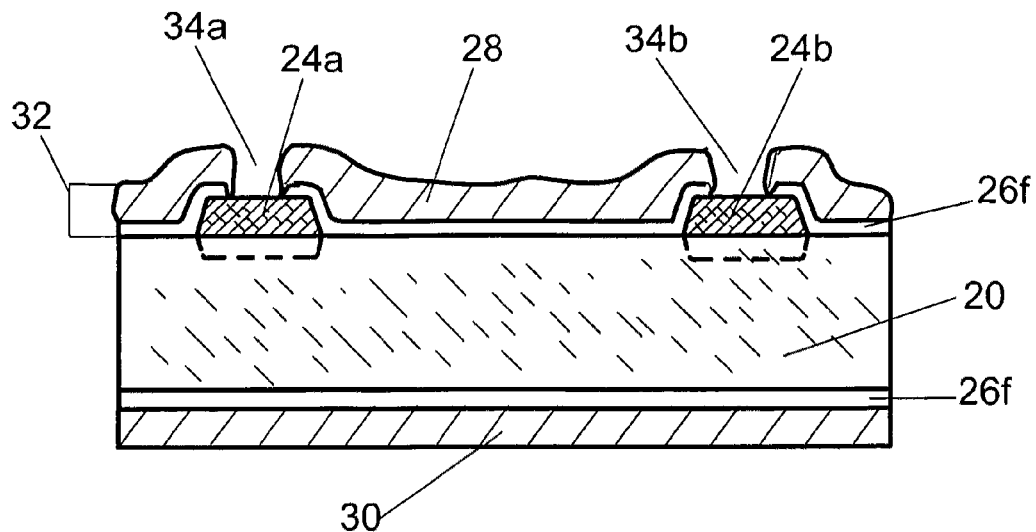
FIG. 5 shows Step 5, in which windows are formed on the front side of the insulating film.

Step 5, which is shown in FIG. 5, is aimed at forming front windows 34a and 34b in the front-side insulating film 32 on the front side of the cell in the initial device structure. Since the positions of the dopant-containing regions 24a and 24b can be seen through the front-side insulating film 32, which is transparent and in view of a significant thickness and relatively large lateral size of dopant-containing regions 24a and 24b, the front windows 34a and 34b can be cut, e.g., by means of a laser (as described in U.S. Pat. No. 6,426,235 issued on Jul. 30, 2002 to T. Matsushita, et al), or, alternatively, a single photolithography step may be required to form the windows. The front windows 34a and 34b may have a width, e.g., in the range of 10 to 20 µm.

Figure 6:
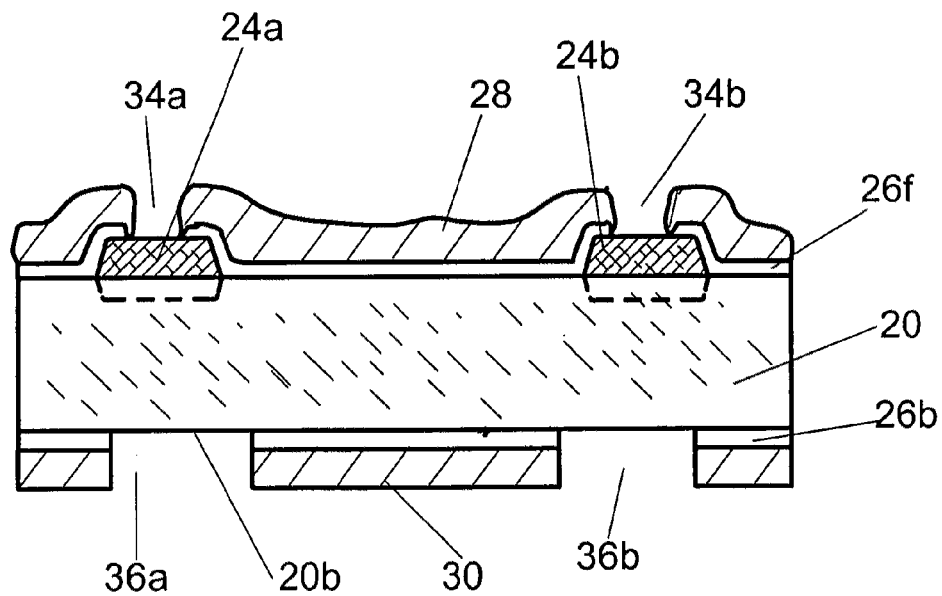
FIG. 6 illustrates Step 6, in which windows are formed on the back side of the insulating film of the initial device structure.

Step 6, which is shown in FIG. 6, comprises formation of back windows 36a and 36b on the back side of the structure shown in FIG. 5. The back widows 36a and 36b are cut through the back-side insulating film 31(FIG. 4) to the back surface 20b of the substrate 20. The back windows can be cut by means of a laser or chemically etched with the use, e.g., of a fixed shadow mask. No photolithography is needed in that case. The back windows 36a and 36b are relatively wide and may have a width in the range of 1 to 5 mm.

Step 7, which is shown in FIG. 7, comprises deposition of a front-side conductive layer 38a and a back-side conductive layer 38b of a stacked metal layers or metal-containing conductive paste layers, onto the front and back surfaces of the initial device structure in FIG. 6, respectively. In other words, the conductive metal or metal-containing paste layers that form the front-side conductive layer 38a are deposited onto the surface of the front-side nitride film ($Si_3N_4$ film) 28 and onto the surface of the front dopant-containing regions 24a and 24b exposed through the front windows 34a and 34b (FIG. 6), respectively. Similarly, the conductive metal or metal-containing paste layers that form the back-side conductive layer 38b are deposited onto the surface of the back-side nitride film (a $Si_3N_4$ film) 30 and onto the back surface of the substrate 20 exposed through the windows 36a and 36b (FIG. 6), respectively. The conductive metal layers used for the front surface can be silver, aluminum, titanium, palladium, nickel, or their combinations and are typically deposited (evaporated) onto the surface in the form of a stack, e.g., Ti—Ag, Ti—Pd—Ag, Ni—Cr, etc. The metal paste can be of a Ti—Ag-type, Ag—Al type, or other types known in the art. Conductive compositions for the back side can include metal layers of Al or Al—Ag, Al—Si, Al—Ag conductive paste, or the like. The compositions of the conductive layers on the front side and on the back side can be different, and these layers can be deposited simultaneously or in sequence. The conductive layers 38a and 38b may have a thickness in the range of 1 to 5 µm. Reference numerals 38b1 and 38b2 designate regions of the back-side conductive layer 38b, the regions being in direct contact with the substrate 20. The back-side conductive layer contains elements that during electrical and thermal treatment function as a back-side dopant to form selective BSF regions.

The broken line designated in FIG. 7 by reference numeral 38a1 shows that the conductive layer, e.g., the layer 38a, can consist of several consecutively applied sublayers. These sublayers can have different compositions.

It should be noted that Steps 1 through 7 are used to form the initial device structure as the basis for subsequent completion of the most critical elements of the solar cell by electrical and thermal means.

Step 8, which is shown in FIG. 8, comprises unique electrical and thermal processing of the structure shown in FIG. 7. In this step, the structure of FIG. 7 is placed into a fixture 40, which is shown in schematic form and is intended for electrical and thermal treatments of the structure, in particular, the areas of dopant-containing regions. The fixture is provided with a front-side current input electrode 42a, a front-side current output electrode 42b, a back-side current input electrode 44a, and a back-side current output electrode 44b. The current input and output electrodes are isolated from each other so that when current is applied to the input electrodes 42a and 44a, the applied current flows from the current input electrodes to the respective current output electrodes through the front-side conductive layer 38a and the back-side conductive layer 38b independently so that current of different magnitudes can pass through the front-side conductive layer 38a and the back-side conductive layer 38b.

In order to provide uniform distribution of the current density over the entire current-passing areas of the conductive layers, the profiles of the electrodes 42a, 42b, 44a, and 44b should conform to the outlines of the substrate 20. When current flows through the conductive layers 38a and 38b, the material of the layers is heated by ohmic heating, which is also known as resistive heating. Thus, the temperature of layers increases. The magnitude of current is selected so as to heat the treated layers to the temperature needed to cause diffusion of the dopant from the dopant-containing regions 24a and 24b (FIG. 7) and from the direct-contact regions 38b1 and 38b2 on the back side into the silicon substrate 20 (FIG. 7). As a result of the elevated temperature, the dopants further diffuse into the silicon substrate, thus forming selective emitters 24e, 24f on the front side and selective BSF regions 25a and 25b on the back side. Although only pairs of the selective-emitter regions and selective BSF regions are shown in FIG. 8, which is a cross-sectional view of the structure, in reality there is a plurality of such regions on both sides of the substrate 20, respectively.

In order to prevent dissipation of heat from the zone 43 of electrical and thermal treatment, this zone can be confined between the thermal insulating walls 46a, 46b, 46c, and 46d. The temperature in the electrical and thermal zone 43 may be higher than the melting point of one or several sublayers of the conductive layer 38a and/or 38b. In order to prevent leakage of the molten material from the zone 43, this zone must be sealed with the thermal insulating walls 46c and 46d. In the process, the maximum temperature of the regions of the dopant diffusion should be in the range of 900 to 1000° C. for the front and 650 to 750° C. for the back. Because of the interaction of heat flows on the front and the back, it may be necessary to conduct the electrical and thermal treatment process for the front and back individually or simultaneously.

In the course of electrical and thermal treatment, the lower portion of the front-side conductive layer 38a interacts with the underlying dopant-containing regions 24a and 24b (FIG. 7) and with the selective emitters 24e, 24f (FIG. 8), whereby a metal-silicon alloy forms in the zone of contact between the interacting materials. On the other hand, interaction of the conductive material of the layer 38a with the $Si_3N_4$ film 28 will be different from that in the areas of the selective emitters 24e and 24f. More specifically, the material of the lower portion of the layer 38a can be selected so that a compound functioning as a diffusion barrier for atoms of metal that can diffuse through the front-side insulating film 32 (FIG. 5) form as a result of the interaction of the material of the layer 38a with the $Si_3N_4$ film 28. For example, if the lower portion of the layer 38a is made of titanium, then a titanium-nitride (TiN) compound is formed. Similar consideration can be applied to the back of the structure.

The front-side conductive layer 38a and the back-side conductive layer 38b can be subjected to the above-described electrical and thermal treatment simultaneously or separately. In selecting parameters for the electrical and thermal treatment, one should consider the difference between the coefficients of thermal expansion of the silicon substrate and materials of the conductive layers. In order to secure the achieved structure and to ensure integrity of its layers for subsequent treatment, cooling is carried out in Step 8.

Figure 9:
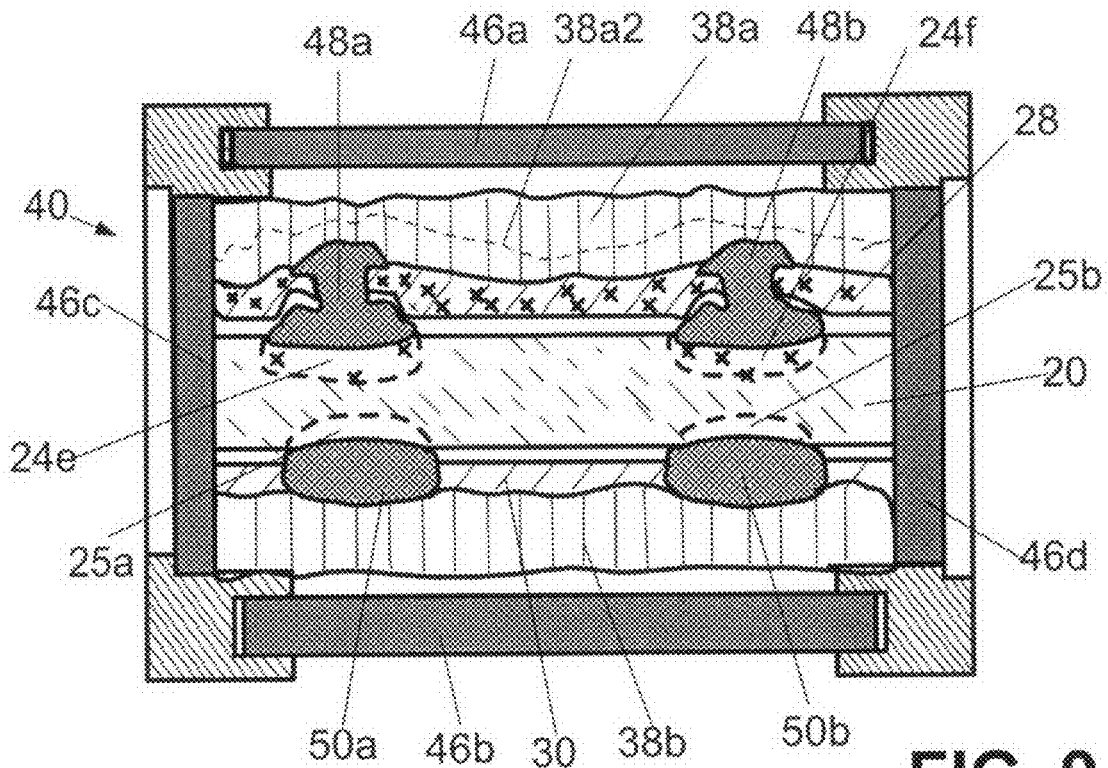
FIG. 9 is a cross-sectional view of the intermediate device structure obtained after the critical Step 8.

FIG. 9 is a cross-sectional view of the structure obtained after the critical Step 8. In other words, the structure shown in FIG. 9 is an intermediate structure obtained before the subsequent pulse electrical treatment, which is described below. Though the supply of current is discontinued, the structure can remain in the fixture 40 to the end of the manufacturing process. As a result of the electrical and thermal treatment described above, in addition to the aforementioned selective emitters 24e and 24f and the selective BSF regions 25a and 25b, alloyed regions, hereinafter referred to as selective-emitter contact regions 48a and 48b, are formed on the front side of the structure, and alloyed regions, hereinafter referred to as contacts to selective BSF regions 50a and 50b, are formed on the back side of the structure.

The aforementioned selective-emitter contact regions 48a and 48b, which may comprise, e.g., an Ag—Si alloy or Ti—Si alloy, and the contacts to selective BSF regions 50a and 50b, which may comprise, e.g., Al—Si alloy, are darkened in FIG. 9 and in all subsequent drawings. In the final solar cell product, these regions provide good Ohmic contacts to the functional areas of the cell, such as selective emitters and silicon substrate.

Diffusion that occurs in Step 8 may cause appearance of defects in N+-P junctions of the selective emitters. These defects, which can be caused by diffusion, e.g., of Ag, Ti, etc., into Si, are marked by "x" symbols in the selective-emitter regions 24e, 24f. Similarly, defects may also occur in the $Si_3N_4$ film 28 because of diffusion, e.g., of Ag. The defects of this region are also marked by symbol "x". The conductive layers 38a and 38b that have uneven outer surfaces caused by electrical and thermal treatment still remain in the structure. Since during electrical and thermal treatment some sublayers of the conductive layers 38a and 38b may be fused and then solidified, different substructures may occur in the conductive layers 38a and 38b. This is shown in FIG. 9 by a broken line 38a2. It is important to note that electrical and thermal treatment does not significantly impair conductive properties, integrity, or adhesion of the conductive layers 38a and 38b to the underlying layers, such as the $Si_3N_4$ layer.

If necessary, some intermediate steps may be required after Step 8, such as chemical mechanical planarization, chemical etching and cleaning, or low-temperature annealing in a gaseous atmosphere.

Figure 10:
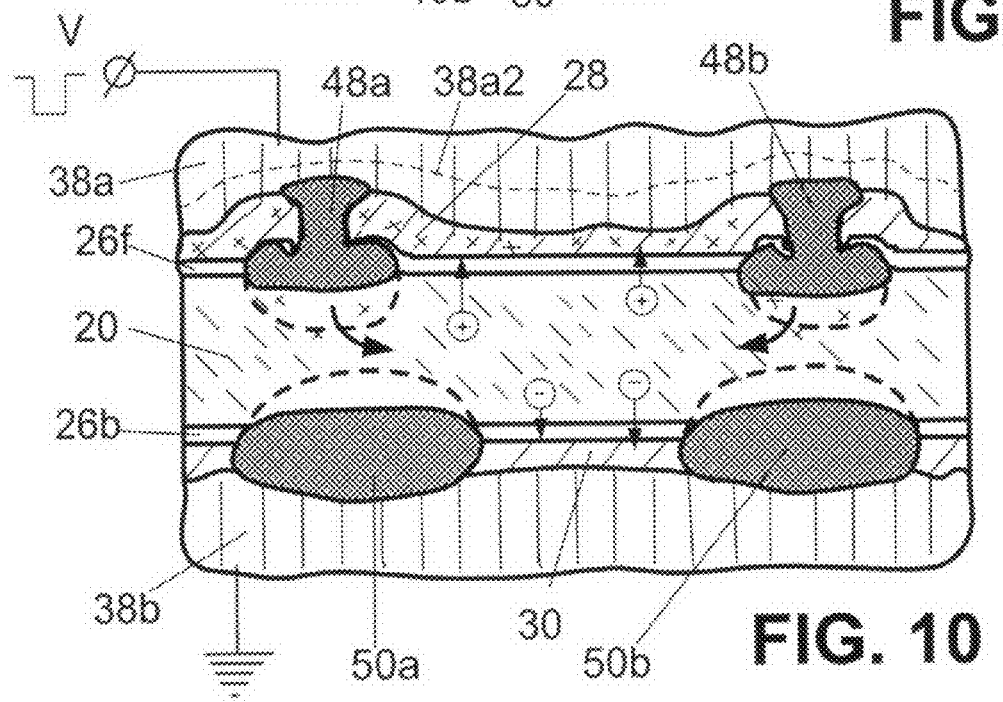
FIG. 10 illustrates Step 9, which is a pulse electrical treatment of the structure in FIG. 9 (for simplicity of the drawings, in FIG. 9 and in subsequent drawings the current-supply and heat-insulating fixture is not shown).

FIG. 10 illustrates Step 9, which is pulse electrical treatment of the intermediate device structure of FIG. 9. For simplicity in FIG. 9 and in subsequent drawings, the fixture 40, in which the structure may remain to the end of the process, is not shown. In Step 9, voltage pulse or a sequence of voltage pulses V is applied between the front-side conductive layer 38a and the back-side conductive layer 38b. Regarding the P-type silicon substrate 20, the pulse V must have a negative sign on the front side. Regarding the N-type silicon substrate 20 (which is not considered herein), the pulse V must have a positive sign on the front side.

As a result, fixed charges of opposite signs form on the front-side insulating film and on the back-side insulating film in order to form the field-induced emitter and the field-induced BSF region.

For the P-type silicon substrate 20, the pulse V causes holes (shown by symbols $\oplus$ in FIG. 10) to drift toward the front side and to enter the $Si_3N_4$ film 28 through the front $SiO_2$ layer 26f. At the same time, the pulse V causes the electrons (shown by symbols $\ominus$ in FIG. 10) to drift toward the back side and to enter the $Si_3N_4$ film 30 through the back-side $SiO_2$ layer 26b. As a result, a fixed positive charge is generated at or around the interface of the $Si_3N_4$ film 28 with the front-side $SiO_2$ layer 26f. Similarly, a fixed negative charge is generated at or around the interface of the $Si_3N_4$ film 30 with the back-side $SiO_2$ layer 26b. The fixed charges are not shown in FIG. 10 but are shown in FIG. 11.

Application of voltage pulse V of the above-described polarity causes flow of a forward current (shown by curved arrows in FIG. 10) through the $N^+$-P junctions of selective emitters. It is assumed that the above current will eliminate all or a significant number of the above-mentioned defects in the selective emitters, thus improving the quality of the selective emitter junctions.

The pulse may have the following parameters: V in the range of 20 to 100V (depending on Si-nitride thickness and other factors), total duration in the range of 1 to 100 ms. If necessary, an embedded test structure can be used to check field-induced emitter (inversion) formation and N+-P junction quality.

Figure 11:
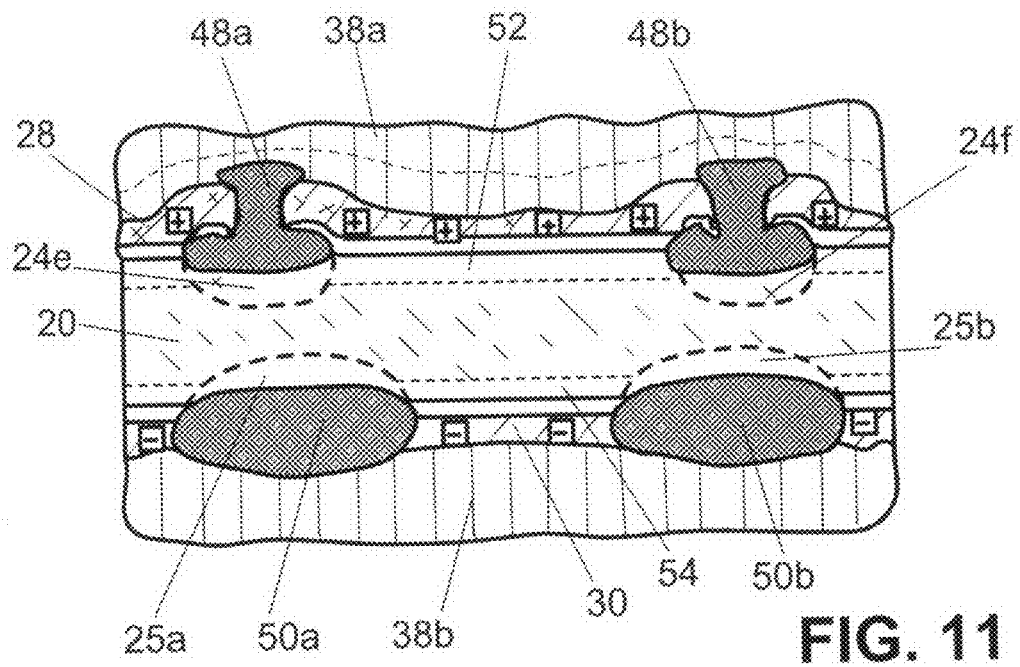
FIG. 11 is a sectional view of the device structure formed after completion of the pulse electrical treatment.

FIG. 11 is a sectional view of the structure formed after completion of the pulse electrical treatment in Step 9. Once the fixed positive charge is introduced into the $Si_3N_4$ film 28, an $N^+$-inversion layer 52 forms on the front side to create a field-induced emitter. In other words, in the final solar cell, this $N^+$-inversion layer 52 functions as a field-induced emitter. At the same time and as a result of introduction of the fixed negative charge into the $Si_3N_4$ film 30, an $P^+$-accumulation layer 54 forms on the back side to create a field-induced BSF region of the cell.

FIG. 12 shows the last Step 10a, in which the front-side conductive layer 38a of the structure in FIG. 11 is removed (e.g., by a lift-off process). Since the selective emitter contact regions 48a and 48b have substantially stronger adhesion to the substrate 20, the lift-off of the conductive layer 38a does not separate the conductive regions 48a and 48b from the selective emitters; therefore, after removal of the conductive layer 38a, the upper surfaces of the selective emitter contact regions 48a and 48b and the $Si_3N_4$ film 28 are exposed. In the solar cell, the selective emitter contact regions 48a and 48b function as front-side self-aligned electrodes.

In the embodiment of FIG. 12, the back-side conductive layer 38b of the structure shown in FIG. 11 remains intact after step 10a and is used in the solar cell as a back-side electrode and a back reflector.

Figure 13:
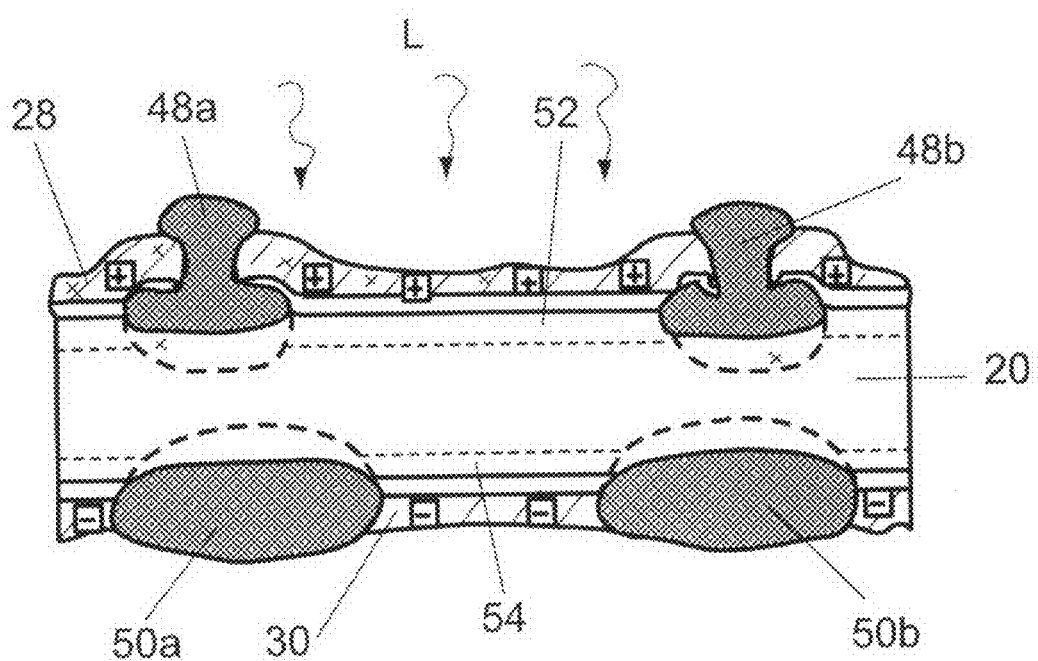
FIG. 13 shows the modification of a final solar cell after Step 10b, in which both the front-side conductive layer and the backside conductive layer are removed.

FIG. 13 shows another embodiment, which is Step 10b. In this embodiment, in addition to the front-side conductive layer 38a, the back-side conductive layer 38b is removed as well. As a result, contacts to the selective BSF regions are formed and are intended to function in the final device as back-side self-aligned electrodes. In fact, FIG. 13 shows a front-side solar cell, which sometimes is referred to as a transparent solar cell.

If necessary, the outer surfaces of the solar cell obtained after Steps 10a and 10b may require some minor finishing operations, such as chemical or mechanical polishing, chemical cleaning, or electroplating of the electrode surfaces.

Although the invention is shown and described with reference to specific embodiments, it is understood that these embodiments should not be construed as limiting the areas of application of the invention and that any changes and modifications are possible provided that these changes and modifications do not depart from the scope of the attached patent claims. For example, dopant substances may be other than those indicated in the specification. The fixture used for supply of current and for thermal insulation of the current-modified structure components may have various designs. The method applies to manufacturing not only of solar cells but to any other suitable electronic device. The silicon substrate may be of an N-type. In this case, the dopant substance of the front side should be a boron-containing composition, the back-side conductive film should contain the dopant source for forming a N+ type BSF regions, and the pulse V shown in FIG. 10 must have a positive sign on the front side.

What is claimed is:

1. A method of manufacturing a silicon-based semiconductor device comprising a silicon substrate that has a front side and a back side, selective emitters, selective emitter contact regions, and a field-induced emitter, the method comprising the step of:
    forming at least the selective emitters and the selective-emitter contact regions by electrical and thermal treatment; and
    forming the field-induced emitter by pulse electrical treatment.

2. The method of claim 1, further comprising the step of forming selective BSF regions and contacts to the selective BSF regions by electrical and thermal treatment.

3. The method of claim 2, wherein the silicon-based semiconductor device further comprises a field-induced BSF region, the method further comprising the step of forming the field-induced BSF region by pulse electrical treatment.

4. The method of claim 1, comprising the following steps, which are completed prior to the step of electrical and thermal treatment:
    forming dopant-containing regions in the areas designed for the selective emitter regions;
    depositing a front-side insulating film at least onto the front side of the silicon substrate;
    forming front windows in the front-side insulating film over the dopant-containing regions to expose at least a part of the surface of the dopant-containing regions;
    depositing a front-side conductive layer onto the front-side insulating film and onto the parts of the dopant-containing regions, which are exposed.

5. The method of claim 4, wherein the step of thermal and electrical treatment comprises passing electrical current through the front-side conductive layer to heat the dopant-containing regions to the temperature required for diffusion of the dopant from the dopant-containing regions to the silicon substrate in order to form the selective emitters and selective emitter contact regions.

6. The method of claim 3, wherein the method comprises the following steps, which are completed prior to the step of electrical and thermal treatment:
    forming dopant-containing regions in the areas designed for the selective emitter regions;
    depositing a front-side insulating film at least onto the front side of the silicon substrate;
    forming front windows in the front-side insulating film over the dopant-containing regions to expose at least a part of the surface of the dopant-containing regions;
    depositing a front-side conductive layer onto the front-side insulating film and onto the parts of the dopant-containing regions, which are exposed; said step of thermal and electrical treatment comprising the step of passing electrical current through the front-side conductive layer to heat the dopant-containing regions to the temperature required for diffusion of the dopant from the dopant-containing regions to the silicon substrate in order to form the selective emitters.

7. The method of claim 6, comprising the following steps, which are completed prior to the step of electrical and thermal treatment:
    depositing a back-side insulating film onto the silicon substrate;
    forming back windows in the back-side insulating film to expose at least a part of the back side of the silicon substrate; and
    depositing a back-side conductive layer that contains a back-side dopant onto the back-side insulating film and into the back windows.

8. The method of claim 7, wherein the step of thermal and electrical treatment further comprises the step of passing electrical current through the back-side conductive layer to heat the back-side conductive layer to the temperature required for diffusion of the back-side dopant from the back-side conductive layer into the silicon substrate in order to form the selective BSF regions and contacts to the selective BSF regions, thus forming an intermediate device structure.

9. The method of claim 8, wherein the pulse electric treatment comprises the step of subjecting the intermediate device structure to a voltage pulse or pulses between the front-side conductive layer and the back-side conductive layer to form fixed charges of opposite signs on the front-side insulating film and on the back-side insulating film and in order to form the field-induced emitter and the field-induced BSF region.

10. The method of claim 9, wherein the selective emitter contact regions are formed by the step of removing the front-side conductive layer from the front-side insulating film.

11. The method of claim 10, wherein contacts to the selective BSF regions are formed by the step of removing the back-side conductive layer from the back-side insulating film.

12. The method of claim 6, wherein the step of forming dopant-containing regions comprises a process selected from the group consisting of screen-printing and jet-printing and wherein the dopant substance is selected from the group consisting of doped silicon nanoparticles, phosphorus-containing paste, boron-containing paste, or a combination thereof.

13. The method of claim 6, wherein the front-side conductive layer is selected from the group consisting of metals and metal pastes, said metals being selected from the group consisting of silver, aluminum, titanium, palladium, nickel, or combinations thereof.

14. The method of claim 7, wherein the back-side conductive layer is selected from the group consisting of metals and metal pastes, said metals being selected from the group consisting of silver and aluminum or a combination thereof.

15. The method of claim 2, wherein the step of thermal and electrical treatment is conducted under thermally insulated conditions.

16. The method of claim 4, further comprising the following steps, which are completed prior to the step of electrical and thermal treatment:
depositing a back-side insulating film onto the back side of the silicon substrate;
forming back windows in the insulating film to expose at least a part of the back side of the silicon substrate; and
depositing a back-side conductive layer that contains a back-side dopant on the insulating film and into the back windows.

17. The method of claim 16, wherein the step of thermal and electrical treatment comprises the step of passing electrical current through the front-side conductive layer and the back-side conductive layer to heat the front-side conductive layer and the back-side conductive layer to temperatures required for diffusion of the dopants from the dopant-containing regions into the silicon substrate and from the back-side conductive layer to the silicon substrate in order to form the selective emitters and the selective BSF regions, thus forming an intermediate device structure.

18. The method of claim 17, wherein the pulse electrical treatment comprises the step of subjecting the intermediate device structure to a voltage pulse or pulses between the front-side conductive layer and the back-side conductive layer to form fixed charges of opposite signs on the front-side insulating film and on the back-side insulating film and in order to form the field-induced emitter and the field-induced BSF region.

19. The method of manufacturing a silicon-based semiconductor device comprising a silicon substrate that has a front side and a back side, selective emitters, selective emitter contact regions, a field-induced emitter, selective BSF regions, a field-induced BSF region, and contacts to selective BSF regions, the method comprising the steps of:
providing a silicon substrate that has a front side and a back side;
applying a dopant substance onto the front side of the silicon substrate in the form of dots or stripes, thus forming dopant-containing regions;
carrying out initial sintering of the dopant-containing regions in order to solidify the dopant substance and to form low-doped selective-emitter regions;
forming a front-side silicon oxide layer at least on the front side of the silicon substrate;
depositing a front-side insulating film onto the silicon oxide layer;
forming front windows on the front-side insulating film and on the silicon oxide layer;
forming a silicon oxide layer on the back side of the silicon substrate;
depositing a back-side insulating film onto the back-side silicon oxide layer;
forming back windows on the back-side insulating film and on the back-side silicon oxide layer;
applying a front-side conductive layer onto the front-side insulating film and onto the front windows and applying a back-side conductive layer onto the back-side insulating film and onto the back-side windows;
performing electrical and thermal treatment by passing electrical current independently through the front-side conductive layer and through the back-side conductive layer, thus forming the selective emitters, the selective BSF regions, selective emitter contact regions, and contacts to the selective BSF regions, thus obtaining an intermediate device structure;
cooling the intermediate device structure to an equilibrium state of the intermediate device structure;
subjecting the intermediate device structure to pulse electrical treatment by applying a voltage pulse or pulses between the front-side conductive layer and the back-side conductive layer of the intermediate device structure;
removing the front-side conductive layer from the intermediate functional structure.

20. The method of claim 19, further comprising the step of removing the back-side conductive layer.

21. The method of claim 19, wherein the silicon-based semiconductor device is a front-side solar cell.

22. The method of claim 20, wherein the silicon-based semiconductor device is a front-side solar cell.

* * * * *